(12) United States Patent
Kamisada et al.

(10) Patent No.: US 11,531,102 B2
(45) Date of Patent: Dec. 20, 2022

(54) DISTANCE MEASUREMENT IMAGE PICKUP APPARATUS

(71) Applicant: Hitachi-LG Data Storage, Inc., Tokyo (JP)

(72) Inventors: Toshimasa Kamisada, Tokyo (JP); Kozo Masuda, Tokyo (JP); Hisataka Sugiyama, Tokyo (JP); Toshimichi Shintani, Tokyo (JP)

(73) Assignee: HITACHI-LG DATA STORAGE, INC., Tokyo (JP)

( * ) Notice: Subject to any disclaimer, the term of this patent is extended or adjusted under 35 U.S.C. 154(b) by 781 days.

(21) Appl. No.: 16/551,795

(22) Filed: Aug. 27, 2019

(65) Prior Publication Data

US 2020/0110177 A1 Apr. 9, 2020

(30) Foreign Application Priority Data

Oct. 3, 2018 (JP) .............................. JP2018-187826

(51) Int. Cl.
*G01S 17/89* (2020.01)
*G01S 17/10* (2020.01)
(Continued)

(52) U.S. Cl.
CPC ........ *G01S 17/10* (2013.01); *H01L 27/14601* (2013.01); *H04N 5/2353* (2013.01);
(Continued)

(58) Field of Classification Search
CPC .......... G01S 17/10; G01S 17/18; G01S 17/32; G01S 17/42; G01S 7/4815; G01S 7/483;
(Continued)

(56) References Cited

U.S. PATENT DOCUMENTS

| 2015/0092019 A1 | 4/2015 | Asano et al. |
| 2018/0149750 A1 | 5/2018 | Kishimoto et al. |
| 2018/0259647 A1* | 9/2018 | Takano ................. G01S 7/487 |

FOREIGN PATENT DOCUMENTS

| JP | 2006-170744 A | 6/2006 |
| WO | 2014/002415 A1 | 5/2016 |
| WO | 2017/022152 A1 | 2/2017 |

OTHER PUBLICATIONS

Japanese Office Action received in corresponding Japanese Application No. 2018-187826 dated Apr. 19, 2022.

* cited by examiner

*Primary Examiner* — Kevin K Pyo
(74) *Attorney, Agent, or Firm* — Mattingly & Malur, PC

(57) ABSTRACT

A distance measurement image pickup apparatus has two measurement periods. In a first distance measurement period, short pulsed light (1T) is irradiated, and exposure is performed in a plurality of exposure periods (A, B, and C) in which exposure timings are shifted. In each exposure period, an exposure gate is opened a plurality of times to perform repetitive exposure, and a first non-exposure period is provided from when a last exposure gate is closed until subsequent pulsed light is irradiated. In a second distance measurement period, long pulsed light (4T) is irradiated, and exposure is performed in a plurality of exposure periods (A, B, and C) in which exposure timings are shifted. In each exposure period, exposure is performed by opening the exposure gate only once, and a second non-exposure period is provided from when a last exposure gate is closed until subsequent pulsed light is irradiated.

5 Claims, 12 Drawing Sheets

(51) Int. Cl.
*H04N 5/235* (2006.01)
*H01L 27/146* (2006.01)
*H04N 5/372* (2011.01)
*G01S 7/4865* (2020.01)
*G01S 7/481* (2006.01)
*G01S 7/483* (2006.01)
*G01S 7/487* (2006.01)
*G01S 17/04* (2020.01)
*G01S 17/18* (2020.01)
*G01S 17/32* (2020.01)
*G01S 17/42* (2006.01)

(52) U.S. Cl.
CPC ............... *G01S 7/483* (2013.01); *G01S 7/487* (2013.01); *G01S 7/4815* (2013.01); *G01S 7/4865* (2013.01); *G01S 17/04* (2020.01); *G01S 17/18* (2020.01); *G01S 17/32* (2013.01); *G01S 17/42* (2013.01); *H01L 27/146* (2013.01); *H04N 5/372* (2013.01)

(58) Field of Classification Search
CPC ..... G01S 7/4865; G01S 7/487; H01L 27/146; H01L 27/14601; H04N 5/2353; H04N 5/372
See application file for complete search history.

$$D = T_0 \cdot \frac{Q_2}{(Q_1 + Q_2)} \cdot \frac{c}{2} \quad (c: \text{SPEED OF LIGHT})$$

FIRST DISTANCE MEASUREMENT PERIOD
(PULSE WIDTH 1T, THREE-TIME EXPOSURE)

SECOND DISTANCE MEASUREMENT PERIOD
(PULSE WIDTH 4T, ONE-TIME EXPOSURE)

DISTANCE MEASUREMENT IMAGE PICKUP APPARATUS

CLAIM OF PRIORITY

The present application claims priority from Japanese patent application serial No. JP 2018-187826, filed on Oct. 3, 2018, the content of which is hereby incorporated by reference into this application.

BACKGROUND OF THE INVENTION

(1) Field of the Invention

The present invention relates to a distance measurement image pickup apparatus that measures a distance to a target by a time of flight of light.

(2) Description of the Related Art

A time of flight (TOF) method of measuring a distance by a time of flight until irradiation light is reflected by a target and returns has been known as a method of measuring a distance to a target. Specifically, exposure is performed by a plurality of exposure gates in which exposure timings are shifted with respect to a light emission timing of intensity-modulated irradiation light, and a delay time of reflected light with respect to the irradiation light is calculated from the exposure amount accumulated in each exposure gate, thereby obtaining a distance.

In the TOF method, distance measurement accuracy (repeated measurement error) and a distance measurement range (measurable distance range) depend on a pulse width (modulation frequency) of irradiation light, and the shorter the pulse width (the higher the modulation frequency), the higher the distance measurement accuracy and the narrower the distance measurement range. For this reason, a method has been proposed to achieve both high distance measurement accuracy and a wide distance measurement range by measuring distances using two types of irradiation light having a short pulse width and a long pulse width and comparing measurement results.

For example, in WO 2017/022152 A, at the time of measurement with a short pulse width (high modulation frequency), when a plurality of exposure gates having different timing shifts are superimposed, a continuous scheme (continuous wave) in which repetitive exposure gates continue without gaps is used. In addition, at the time of measurement with a long pulse width (low modulation frequency), when a plurality of exposure gates having different timing shifts are superimposed, a pulse scheme is used in which a certain non-exposure period is present between an end of an exposure gate having a largest timing shift and a start of a subsequent exposure gate having a smallest timing shift.

In measurement with a short pulse width, repeatedly displayed distance data is obtained in units of narrow distance measurement ranges. On the other hand, in measurement with a long pulse width, distance data in a wide distance measurement range is obtained. Further, a method (de-aliasing) is used to solve repetition of the former distance data using the latter distance data to determine a distance.

SUMMARY OF THE INVENTION

In the case of operating a plurality of distance measurement image pickup apparatuses in the same area, when irradiation light (or reflected light) other than an own apparatus becomes interference light and is exposed by the own apparatus, there is a problem that an error occurs in a distance measurement value. As a countermeasure, there is a known method of reducing a distance measurement error due to interference by changing a modulation frequency of a light emission pulse for each apparatus. However, applying this method to a configuration of WO 2017/022152 A is difficult due to the following reason.

In the configuration of WO 2017/022152 A, to reduce interference during operation of a plurality of apparatuses, it is necessary to change a modulation frequency for each apparatus. In a pulse scheme, it is possible to select two methods of a method of changing a pulse interval of irradiation light by changing a length in a non-exposure period without changing a pulse width and a method of changing widths of a light emission pulse and an exposure gate, and a non-exposure period in similar figures by changing a pulse width. However, in the continuous scheme, since there is no non-exposure period, basically, only the method of changing the pulse width is selected. When a pulse width is changed, a distance measurement range is changed. Thus, in the case of performing de-aliasing using data of both the continuous scheme and the pulse scheme, the pulse width needs to be changed commonly in the continuous scheme and the pulse scheme.

In the continuous scheme, it is conceivable to provide a non-exposure period and change a length of the non-exposure period as in the pulse scheme. However, as described below, it is necessary to increase the number of consecutive exposure gates, and there is a problem that a distance measurement error due to interference light increases.

In addition, since the distance is measured using two types of irradiation light having a high modulation frequency and a low modulation frequency, when a plurality of apparatuses is operated in the same area, interference light having two types of frequencies of the other apparatus is exposed without being synchronized with irradiation light of the own apparatus. For this reason, for example, at the time of exposure of a high modulation frequency, interference light of a low modulation frequency is exposed, or interference light of both a low modulation frequency and a high modulation frequency is simultaneously exposed. Further, in the case of the method of changing the pulse width, since the distance measurement range is changed by changing the pulse width, the pulse width may not be largely changed, and it is difficult to reduce the distance measurement error due to the interference light.

As described above, in a scheme of measuring a distance using two types of irradiation light having a high modulation frequency and a low modulation frequency as described in WO 2017/022152 A, even though it is possible to obtain high distance measurement accuracy and a wide distance measurement range, it is difficult to reduce a distance measurement error due to interference between a plurality of distance measurement image pickup apparatuses.

In view of the above problem, an object of the invention is to provide a distance measurement image pickup apparatus that achieves both high distance measurement accuracy and a wide distance measurement range and reduces a distance measurement error due to interference between a plurality of apparatuses.

In a distance measurement image pickup apparatus of the invention, one frame corresponding to a unit of a measurement operation includes a first distance measurement period having a pulsed light width $T_H$ and a second distance measurement period having a pulsed light width $T_L$ (where $T_H<T_L$). The first distance measurement period is divided into a plurality of exposure periods in which exposure timings are shifted with respect to the irradiated pulsed light, an exposure gate is opened n times (n is plural) at a predetermined interval between one pulsed light and subsequent pulsed light to perform repetitive exposure in each of the divided exposure periods, and a first non-exposure period in which exposure is not performed from when a last exposure gate is closed until subsequent pulsed light is irradiated is provided. The second distance measurement period is divided into a plurality of exposure periods in which exposure timings are shifted with respect to the irradiated pulsed light, an exposure gate is opened once to perform exposure between one pulsed light and subsequent pulsed light in each of the divided exposure periods, and a second non-exposure period in which exposure is not performed from when the exposure gate is closed until subsequent pulsed light is irradiated is provided.

According to the invention, it is possible to achieve both high distance measurement accuracy and a wide distance measurement range and reduce a distance measurement error due to interference between a plurality of apparatuses.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF THE EMBODIMENTS

Hereinafter, an embodiment of the invention will be described with reference to drawings.

Figure 1:
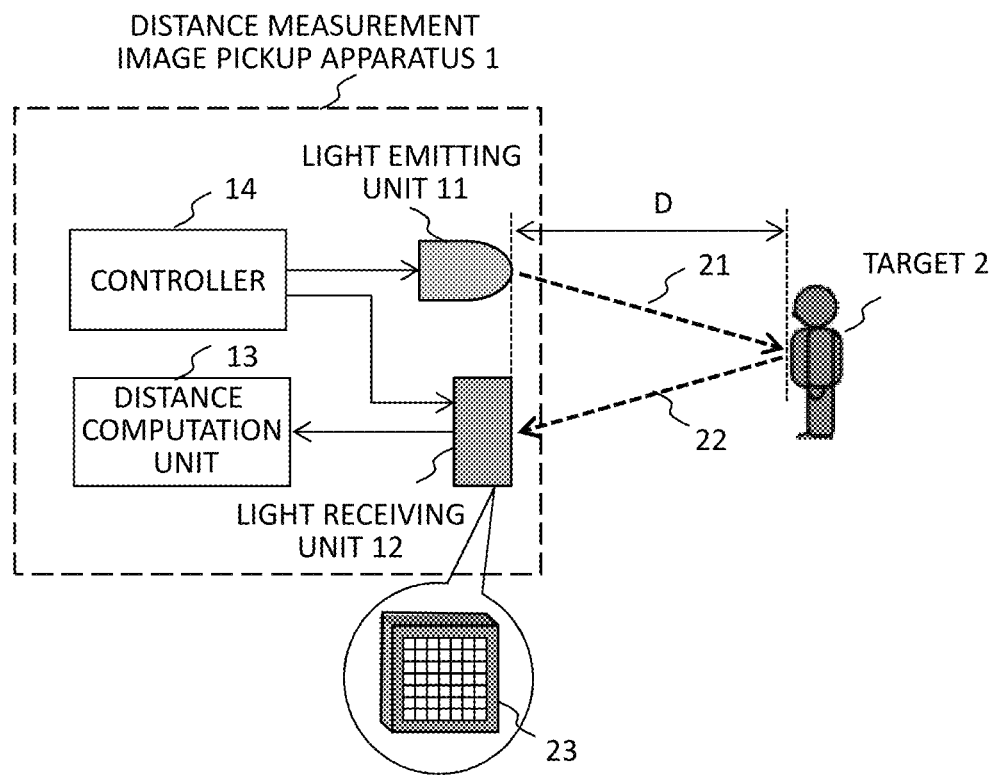
FIG. 1 is a configuration diagram illustrating a distance measurement image pickup apparatus according to an embodiment of the invention.

FIG. 1 is a configuration diagram illustrating a distance measurement image pickup apparatus according to an embodiment of the invention. In the distance measurement image pickup apparatus 1, a distance to a measurement target 2 such as a person or an object is measured by a TOF method, and a measured distance to each part of the target is output as two-dimensional (2D) distance data. A configuration of the apparatus includes a light emitting unit 11, a light receiving unit 12, a distance computation unit 13, and a controller 14. The light emitting unit 11 emits pulsed irradiation light 21 emitted by a light source such as a laser diode (LD) or a light emitting diode (LED). The light receiving unit 12 exposes pulsed reflected light 22 irradiated and reflected back to the target 2 using an image sensor 23 having pixels arranged in a 2D manner such as a charge coupled device (CCD) and a complementary metal oxide semiconductor (CMOS), and converts the light into an electric signal. The distance computation unit 13 computes a distance D from an output signal of the light receiving unit 12 to the target 2. The controller 14 controls the light emitting unit 11, the light receiving unit 12, and the distance computation unit 13, and controls a light emission timing of the irradiation light 21 in the light emitting unit 11 and an exposure timing of the reflected light 22 in the light receiving unit 12. As described above, the distance measurement image pickup apparatus 1 has a configuration similar to that of a digital camera for capturing an image of the target 2 using the image sensor 23, and acquires the distance D to the target 2 as 2D data.

Figure 2:
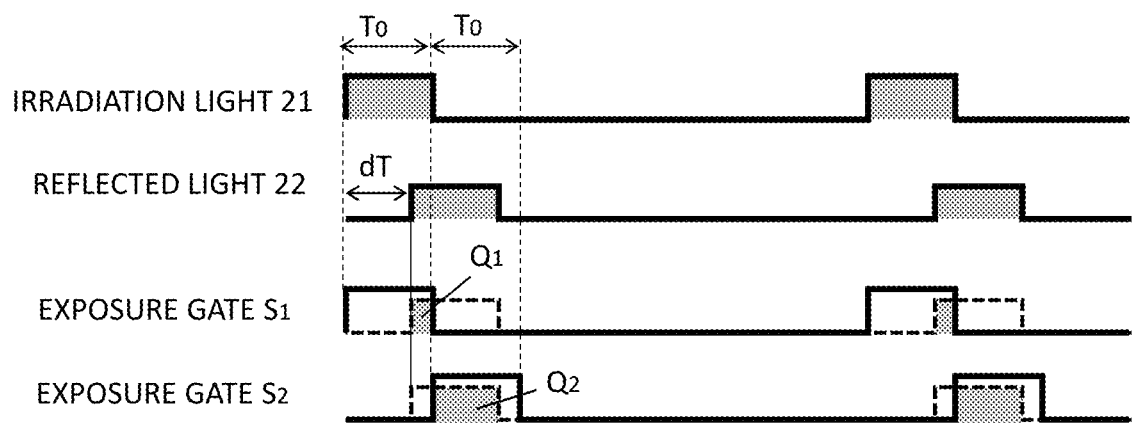
FIG. 2 is a diagram for description of a principle of distance measurement by a TOF method.

FIG. 2 is a diagram for description of a principle of distance measurement by a TOF method. In the TOF method, the distance D is measured based on a time difference between a signal of the irradiation light 21 and a signal of the reflected light 22, that is, a delay time dT. A relationship between the distance D to the target 2 and the delay time dT is represented by $D=dT \cdot c/2$, where c is the speed of light.

However, in this example, without directly measuring the delay time dT, a light receiving period is divided into a plurality of exposure gates to indirectly obtain the delay time dT from the exposure amount of each gate period, and the distance D is measured (also referred to as an indirect method).

FIG. 2 illustrates a case in which an exposure operation is performed in, for example, two gates for one-time irradiation light 21 (pulse width $T_0$). That is, an exposure period of the reflected light 22 is divided into a first exposure gate $S_1$ and a second exposure gate $S_2$, and a width of each gate is made equal to the pulse width $T_0$ of the irradiation light 21. The light receiving unit 12 converts the exposure amounts in the first exposure gate $S_1$ and the second exposure gate $S_2$ into charge amounts, and outputs the charge amounts as a first charge amount $Q_1$ and a second charge amount $Q_2$.

In this instance, the first and second charge amounts $Q_1$ and $Q_2$, the delay time dT, and the distance D to the target 2 are as follows.

$$dT = T_0 \cdot Q2/(Q1+Q2)$$

$$D = T_0 \cdot Q2/(Q1+Q2) \cdot c/2$$

That is, the distance D can be calculated by measuring the first charge amount $Q_1$ and the second charge amount $Q_2$. The above description corresponds to a principle of distance measurement by the TOF method. In this example, distance measurement is performed by combining two distance measurement schemes of different pulse widths $T_0$ and exposure gates $S_1$ and $S_2$.

Figure 3:
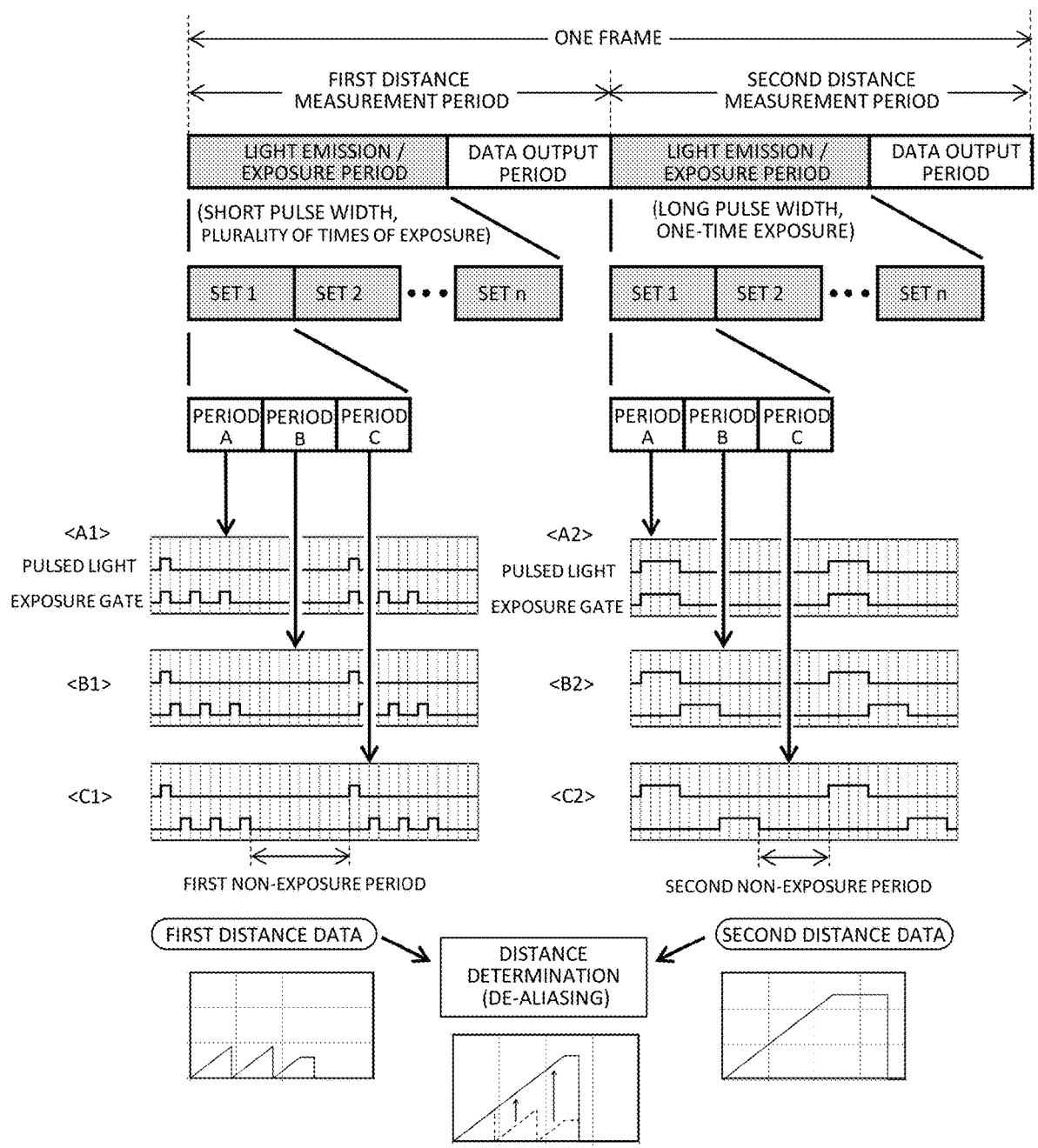
FIG. 3 is a diagram illustrating a configuration of one frame in distance measurement.

FIG. 3 is a diagram illustrating a configuration of one frame in distance measurement. The distance to the target is measured in units of frames to correspond to an image capturing operation. One frame includes a first distance measurement period and a second distance measurement period having different light emission/exposure timings, and first distance data and second distance data are acquired from each period.

First, the first distance measurement period will be described. In the light emission/exposure period, a light emission/exposure operation of a short pulse width (high modulation frequency) is performed. The light emission/exposure period includes n sets. In one set, periods A, B, and C are included by shifting an exposure timing with respect to a light emission pulse, and exposure is divided and performed. In each divided period, as indicated by reference symbols A1, B1 and C1, between one light emission pulse and a subsequent light emission pulse, the exposure gate is opened a plurality of times (here, three times) at predetermined intervals to perform exposure, and charges are accumulated. In one set, the light emission/exposure operation is repeated m times, and this operation is repeatedly performed for n sets.

In a data output period, the charge amount for m×n times accumulated in each of the periods A, B, and C is read to calculate the distance, and first distance data in the first distance measurement period is output. As described above, in the first distance measurement period, reflected light for one light emission pulse is exposed a plurality of times at predetermined intervals, and such a light emission/exposure scheme is referred to as an "extended pulse scheme".

Next, the second distance measurement period will be described. In the light emission/exposure period, light emission/exposure is performed with a long pulse width (low modulation frequency). As in the first distance measurement period, one set has periods A, B, and C having shifted exposure timings, and exposure is divided and performed. However, in each divided period, as indicated by reference symbols A2, B2 and C2, between one light emission pulse and a subsequent light emission pulse, the exposure gate is opened only once to perform exposure and charges are accumulated. The light emission/exposure operation is repeated m times within one set, and this operation is repeatedly performed for n sets.

In a data output period, the charge amount for m×n times accumulated in each of the periods A, B, and C is read to calculate the distance, and second distance data in the second distance measurement period is output. Hereinafter, the light emission/exposure scheme in the second distance measurement period is referred to as a "pulse scheme".

As described above, widths of the pulsed light and the exposure gate, and the number of exposure repetitions are different between the first distance measurement period and the second distance measurement period. By measuring with a short pulse width (high frequency) in the first distance measurement period, a measurement result having high distance measurement accuracy is obtained. Meanwhile, by measuring with a long pulse width (low frequency) in the second distance measurement period, a measurement result having a wide distance measurement range is obtained. By combining both the measurement results and determining the distance (de-aliasing), it is possible to perform measurement with high distance measurement accuracy and a wide distance measurement range. Any of the first distance measurement period and the second distance measurement period may precede the other one.

Further, the present embodiment is characterized in that in the first distance measurement period and the second distance measurement period, instead of continuously performing one light emission/exposure operation and a subsequent light emission/exposure operation, after closing a last exposure gate until subsequent pulsed light is emitted, the first/second non-exposure periods are inserted, respectively. That is, the "extended pulse scheme" in the first distance measurement period is different from the "continuous scheme" in which the light emission/exposure operation is continuously performed. In this way, by providing the non-exposure period in any of the first distance measurement period and the second distance measurement period, as will be described below, it is possible to reduce a distance measurement error due to interference between apparatuses when a plurality of distance measurement image pickup apparatuses is operated.

The present embodiment describes that the exposure operation for one set is divided into three periods (periods A, B, and C) in which the exposure timing is shifted. However, the number of divided periods is not limited thereto, and an arbitrary number corresponding to a plural number may be adopted.

Figure 4:
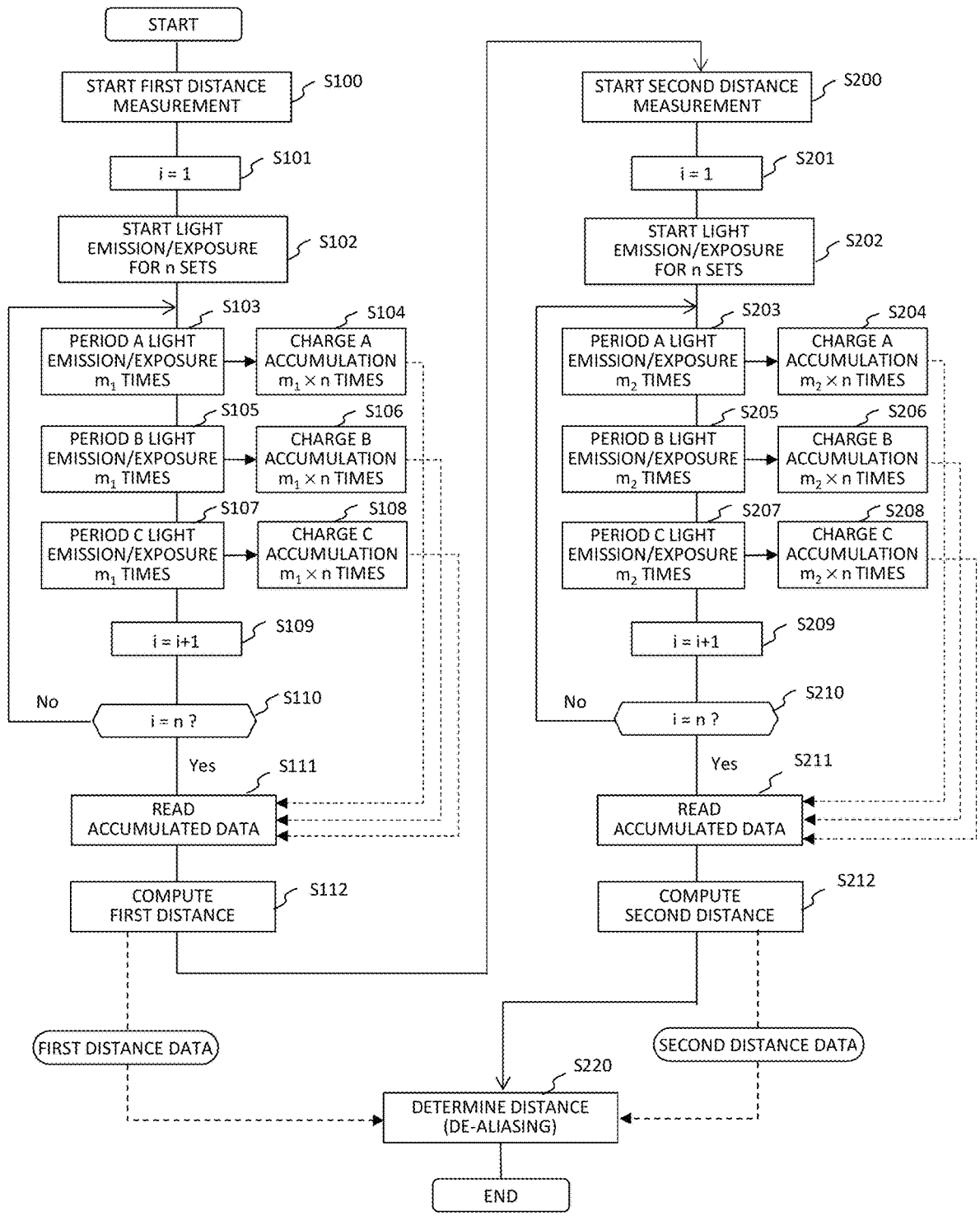
FIG. 4 is a diagram illustrating a flowchart of distance measurement processing in one frame.

FIG. 4 is a diagram illustrating a flowchart of distance measurement processing in one frame. In one frame period, first distance measurement (S100~) and second distance measurement (S200~) are performed, and a distance is determined using distance data of both the first distance measurement and the second distance measurement (S220).

First, when the first distance measurement is started (S100), a counter i is set to 1 (S101), and light emission/exposure for n sets is started (S102). In a light emission/exposure operation, first, in period A light emission/exposure (S103), light emission/exposure indicated by timing A1 of FIG. 3 is performed $m_1$ times, and charge (charge A) generated by exposure is accumulated (S104). Subsequently, period B light emission/exposure (light emission/exposure indicated by timing B1 of FIG. 3) is performed $m_1$ times (S105), and charge (charge B) generated by exposure is accumulated (S106). Furthermore, period C light emission/exposure (light emission/exposure indicated by timing C1 of FIG. 3) is performed $m_1$ times (S107), and charge (charge C) generated by exposure is accumulated (S108). Further, the counter i is incremented by 1 (S109), and it is determined whether the counter i has reached a specified number of times n (S110).

When the specified number of times n has not been reached (No in S110), the process returns to S103 and repeats from the period A light emission/exposure. In this manner, the charge A, the charge B, and the charge C for $m_1 \times n$ times are accumulated in the light receiving unit 12. When the counter i has reached the specified number of times n (Yes in S110), accumulated data of the charge amount is read from the light receiving unit 12 (S111). The distance computation unit 13 computes a distance (first distance data) to the target 2 using the read amount of the charge A and the charge C (S112).

Subsequently, the second distance measurement is started (S200). Since the second distance measurement has the same procedure as that of the first distance measurement (S100), a repeated description will be omitted. However, in the period A light emission/exposure (S203), light emission/exposure indicated by timing A2 of FIG. 3 is performed $m_2$ times, and charge (charge A) generated by exposure is accumulated (S204). The period B light emission/exposure (S205) is performed at timing B2 of FIG. 3, and the period C light emission/exposure (S207) is performed at timing C2 of FIG. 3. When the counter i reaches the specified number of times n (Yes in S210), the accumulated data of the charge amount is read from the light receiving unit 12 (S211). The distance computation unit 13 computes the distance to the target 2 (second distance data) using the read amount of the charge A to the charge C (S212).

The distance computation unit 13 determines the distance using the first distance data obtained in S112 and the second distance data obtained in S212 (S220). Details of computation will be described below. In the first distance measurement, distance data repeatedly displayed in units of narrow distance measurement ranges is obtained. On the other hand, in the second distance measurement, distance data of a wide distance measurement range is obtained. Using this data, repetition of the first distance data is solved to determine the distance (de-aliasing).

The number $m_1$ and $m_2$ of repetitions of light emission/exposure in one set and the number n of sets in the first distance measurement and the second distance measurement are appropriately set according to the length of one frame period.

Next, specific examples of the distance measurement will be described in Example 1 and Example 2.

Example 1

Figure 5A:
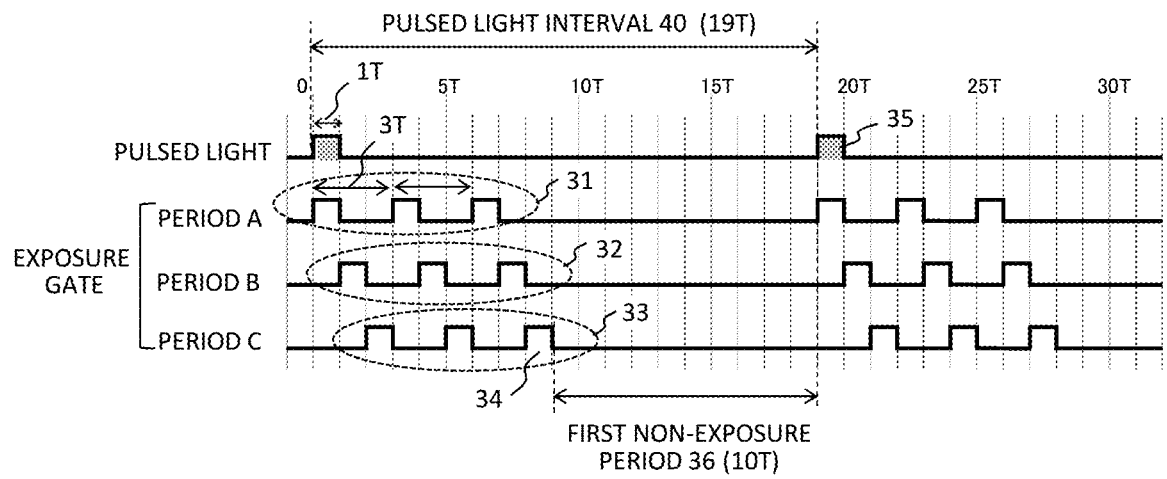
FIG. 5A and FIG. 5B are diagrams illustrating light emission/exposure time charts in Example 1.
Figure 5B:
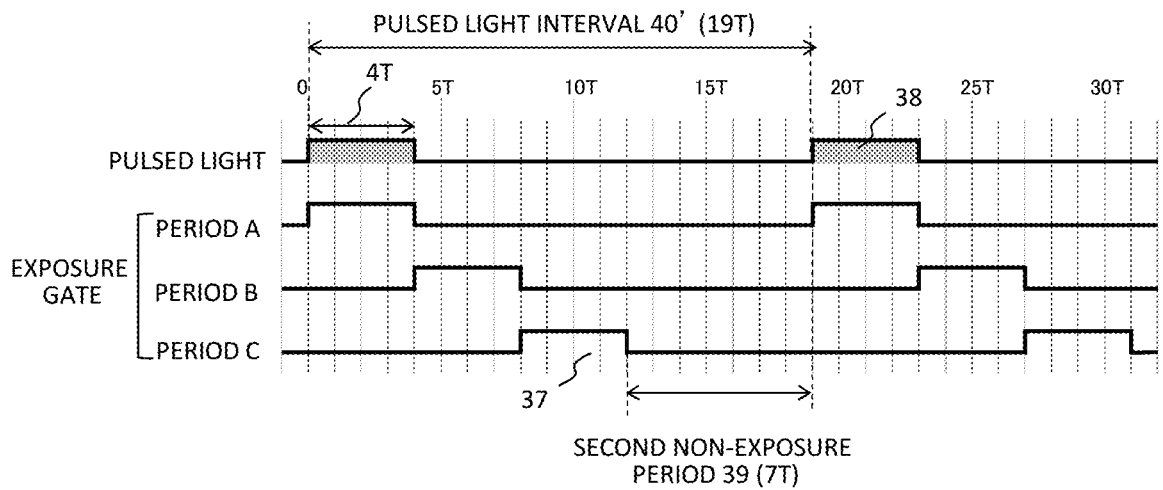

FIG. 5A and FIG. 5B are diagrams illustrating light emission/exposure time charts in Example 1.

FIG. 5A illustrates light emission/exposure timing of the first distance measurement period. A short pulse width 1T is used as a light emission pulse, which is exposed by an exposure gate having the same width 1T (high modulation frequency). In the exposure period, exposure is performed in periods A, B, and C, timing of each of which is shifted by 1T. In each period, between one light emission pulse and a subsequent light emission pulse (reference symbol 35), the exposure gate is opened three times in a period 3T to perform repetitive exposure (reference symbols 31, 32, and 33), which corresponds to the "extended pulse scheme" introduced in this example. Then, a first non-exposure period 36 (here, a width of 10T) in which exposure is not performed after a last exposure gate (reference symbol 34) is closed until subsequent pulsed light (reference symbol 35) is emitted is provided. In this way, a pulsed light interval 40 corresponds to a width of 19T.

FIG. 5B illustrates light emission/exposure timing of the second distance measurement period. A long pulse width 4T is used as a light emission pulse, which is exposed by an exposure gate having the same width 4T (low modulation frequency). In the exposure period, exposure is performed in periods A, B, and C, timing of each of which is shifted by 4T. In each period, the exposure gate is opened only once for one light emission pulse to perform exposure, which corresponds to the conventional "pulse scheme". Then, a second non-exposure period 39 (here, a width of 7T) in which exposure is not performed after a last exposure gate (reference symbol 37) is closed until subsequent pulsed light (reference symbol 38) is emitted is provided. In this way, a pulsed light interval 40' corresponds to a width of 19T.

Here, even though the pulsed light interval 40 in the first distance measurement period and the pulsed light interval 40' in the second distance measurement period are made equal to each other, lengths of the non-exposure period 36 and the second non-exposure period 39 may be set so that a ratio thereof has an integer multiple relationship.

Figure 6A:
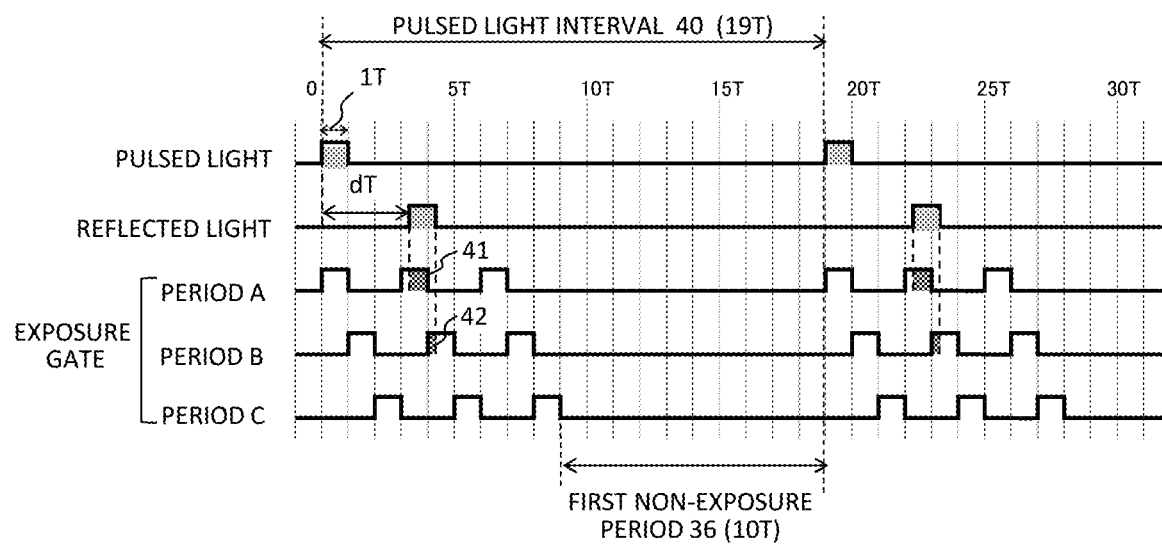
FIG. 6A and FIG. 6B are diagrams illustrating a distance calculation method in Example 1.
Figure 6B:
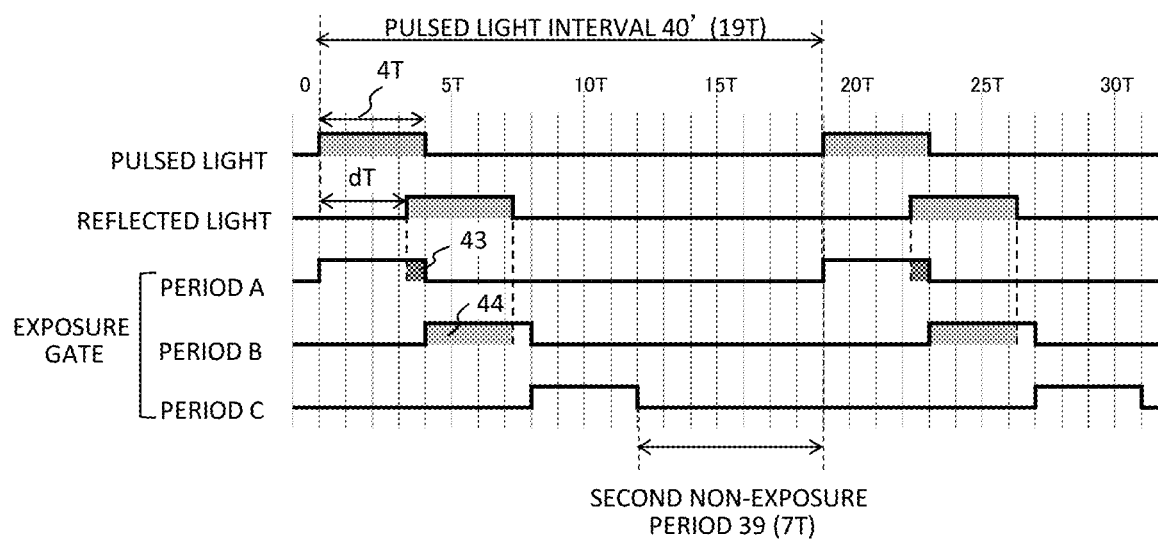

FIG. 6A and FIG. 6B are diagrams illustrating a distance calculation method in Example 1.

FIG. 6A illustrates distance calculation in the first distance measurement period. Reflected light for one light emission pulse is exposed by any two consecutive gates of periods A, B and C. In this example, exposure is performed in the period A and the period B, which is indicated by reference symbols 41 and 42. When the amounts of charges generated by exposure in the periods A, B, and C are set to A, B, and C, respectively, the equation of FIG. 2 is expanded, and a delay time dT of the reflected light with respect to the irradiation light is expressed by the following equation. A calculation formula is divided depending on the magnitude relationship between the charge amounts A, B, and C.

If MIN($A, B, C$)=$C$, $dT=\{(B-C)/(A+B-2C)\} \cdot T+3nT$

If MIN($A, B, C$)=$A$, $dT=\{(C-A)/(B+C-2A)\} \cdot T+T+3nT$

If MIN($A, B, C$)=$B$, $dT=\{(A-B)/(C+A-2B)\} \cdot T+2T+3nT$

Here, MIN is a function for obtaining a minimum value. "n" is a parameter representing an nth period in which exposure is performed in three times of repetitive exposure, and is referred to as the number of repetitions. Here, n=0, 1, and 2 represent the first, second and third times, respectively.

In measurement in the first distance measurement period, it is impossible to specify the number n of repetitions since it is not known at what exposure the signal is obtained. Therefore, in the first distance measurement period, the first distance data $D_{1T}$ is computed from dT when n=0 as follows.

$D_{1T}=c \cdot dT_{(n=0)}/2$

Here, a range of a measurable distance (distance measurement range) will be described. The distance measurement range $D_R$ is obtained from a reflected light delay time $dT_R$.

$dT_R$=(pulse width)×(number of times of repetitive exposure×3−1)

$D_R=c \cdot dT_R/2$

In the first distance measurement period, since the pulse width=1T and the number of times of repetitive exposure=3, $dT_R=1T \cdot (3 \times 3-1)=8T.$ On the other hand, in the conventional one-time exposure, $dT_R=1T \cdot (1 \times 3-1)=2T.$ Thus, the distance measurement range $D_R$ is expanded by four times.

FIG. 6B illustrates distance calculation in the second distance measurement period. Reflected light for one light emission pulse is exposed by any two consecutive gates of periods A, B and C, which are indicated by reference symbols 43 and 44. In this case, from the amounts of the charges A, B and C generated by exposure in the periods A, B and C, the delay time dT of the reflected light with respect to the irradiation light is expressed by the following equation. However, in this calculation, the pulse width is replaced with 4T and the number of repetitions is replaced with n=0 in calculation in the first distance measurement period.

If $A \geq C$, $dT=\{(B-C)/(A+B-2C)\} \cdot 4T$

If $A<C$, $dT=\{(C-A)/(B+C-2A)\} \cdot 4T+4T$

From dT, the second distance data $D_{4T}$ is calculated as follows.

$D_{4T}=c \cdot dT/2$

When the reflected light delay time is set to $dT_R$, $dT_R=4T \cdot (1 \times 3-1)=8T$.

Thus, the distance measurement range $D_R$ in this case matches the distance measurement range $D_R$ in the first distance measurement period.

However, in the second distance measurement period, the pulse width of the reflected light is quadrupled and the shot noise is doubled when compared to the first distance measurement period. Therefore, even though the distance measurement range is wide, the measurement accuracy is worse than that in the first distance measurement period.

Thereafter, the number of repetitions n of the first distance measurement period is specified using the second distance data $D_{4T}$ of the second distance measurement period, and an accurate distance D is determined from the first distance data $D_{1T}$.

Figure 7:
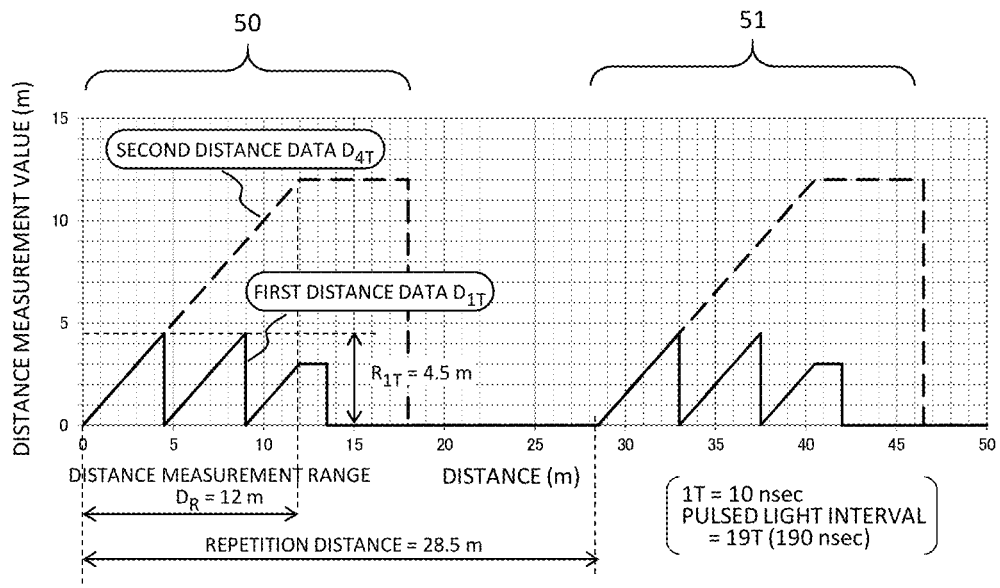
FIG. 7 is a diagram illustrating an example of a measurement result in first/second distance measurement periods.

FIG. 7 is a diagram illustrating an example of measurement results of the first and second distance measurement periods. A horizontal axis corresponds to an actual distance to the target, and a vertical axis corresponds to a value of a measured distance. A unit of a time axis in FIGS. 5A and 5B and FIGS. 6A and 6B is set to 1T=10 nsec. When the horizontal axis is represented by a long distance range, a measurement result indicated by reference symbol 50 obtained from a close distance and a measurement result indicated by reference symbol 51 obtained from a long distance are present.

First, in the result indicated by reference symbol 50 obtained from the short distance, the first distance data $D_{1T}$ (indicated by a solid line) in the first distance measurement period (pulse width=1T) is a straight line having a repetition. A distance to a repetition point (repetition distance) $R_{1T}$ is a maximum measurement distance at n=0, and $R_{1T}=3cT/2=4.5$ m. In addition, a linear portion having a slope is a measurable distance measurement range $D_R$, and $8cT/2=12$ m.

The second distance data $D_{4T}$ (indicated by a broken line) in the second distance measurement period (pulse width=4T) is a straight line having no repetition. The distance measurement range $D_R$ (gradient part) is $8cT/2=12$ m, which is equal to the distance measurement range $D_R$ of the first distance data $D_{1T}$.

Next, the result indicated by reference symbol 51 obtained from a long distance will be described. When the target is at a long distance, the reflected light does not return in an exposure gate period for the pulsed light, and returns in an exposure gate period for subsequent pulsed light. That is, the result indicated by reference symbol 51 is a result measured by pulsed light irradiated one before. In this example, the pulsed light interval is set to 19T (190 nsec), and the measurement result 51 from a position farther than a distance 28.5 m as a starting point is repeatedly obtained in the same pattern as that of the measurement result 50 at the short distance. However, since a flight distance of the pulsed light increases, the intensity of a signal to be exposed attenuates.

However, the measurement result 51 obtained from a long distance is not originally intended and becomes a noise component for the measurement result 50 at a short distance when the measurement result 51 is left. Thus, the measurement result needs to be invalidated. As a countermeasure, the non-exposure period is extended to widen the pulsed light interval, and the reflected light is weak and can be neglected by being moved away to an unexposed distance. However, when the pulsed light interval is excessively widened, the number of times of repetitive exposure within the exposure period decreases and the distance measurement accuracy decreases. Therefore, it is desirable that the pulsed light interval is twice or more the distance measurement range in both the first and second distance measurement periods. When the flight distance of light is doubled, the exposure amount is reduced to ¼, and thus a threshold value can be set for the exposure amount to invalidate the reflected light from a distance of twice or more. Under the condition of Example 1, the pulsed light interval (19T=28.5 m) is about 2.4 times the distance measurement range (8T=12 m).

Figure 8:
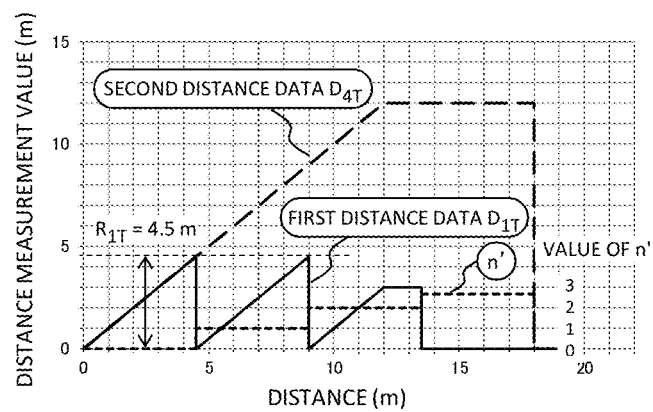
FIG. 8 is a diagram for description of a method of determining a distance from first/second distance measurement results.
Figure 9:
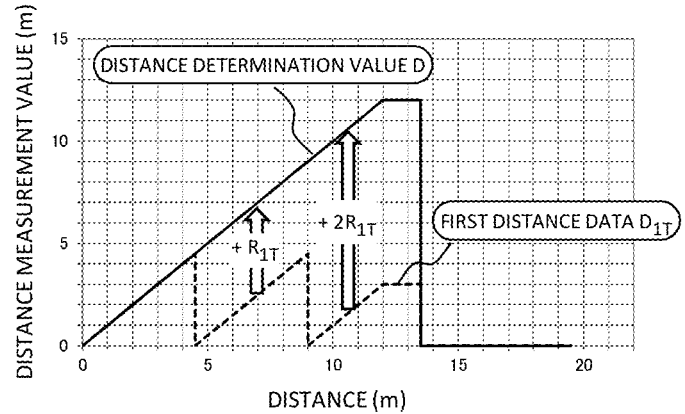
FIG. 9 is a diagram for description of a method of determining a distance from the first/second distance measurement results.

FIG. 8 and FIG. 9 are diagrams for description of a method of determining (de-aliasing) a distance using the first/second distance measurement results.

FIG. 8 illustrates the measurement result indicated by reference symbol 50 of FIG. 7 again. In de-aliasing, using the second distance data $D_{4T}$, the number n of repetitions in the first distance data $D_{1T}$ (a parameter indicating an nth period in which exposure is performed) is obtained in the following procedure.

First, a ratio n' of a difference between the first and second distance data to the repetition distance $R_{1T}$ (=3cT/2) of the first distance measurement period is obtained. The ratio n' is a value corresponding to the number n of repetitions to be obtained.

$n'=(D_{4T}-D_{1T})/R_{1T}$ n' is indicated by a dotted line. Since measurement errors are included in the first distance data $D_{1T}$ and the second distance data $D_{4T}$, n' is not an original integer value and is involved with a fraction after a decimal point. Therefore, n' is converted into an integer by a round function (rounding off to the nearest integer).

$n=\text{ROUND}(n')$

Thus, a real value (integer value) n of the number of repetitions is obtained.

FIG. 9 illustrates a distance output after de-aliasing. Using the real value n of the number of repetitions described above, the accurate distance D is determined by the following equation.

$D=D_{1T}+n \cdot R_{1T}=D_{1T}+n \cdot 3cT/2$

In this calculation, the repetition distance $R_{1T}$ is added n times to the first distance data $D_{1T}$. Here, since the first distance data $D_{1T}$ has high distance measurement accuracy, and the repetition distance $R_{1T}$ to be added is a constant (3cT/2) determined from a unit time T and the speed of light c, the accurate distance D can be determined. In this way, it is possible to perform measurement achieving both the high distance measurement accuracy and the wide distance measurement range.

Since the distance is beyond the measurement range after 13.5 m, the distance calculation is not performed as invalid data. In this case, a relationship of the charge amount is (A+B−2C)=0, which may be used as a determination condition.

Next, measures against interference light between a plurality of distance measurement image pickup apparatuses will be described.

Figure 10A:
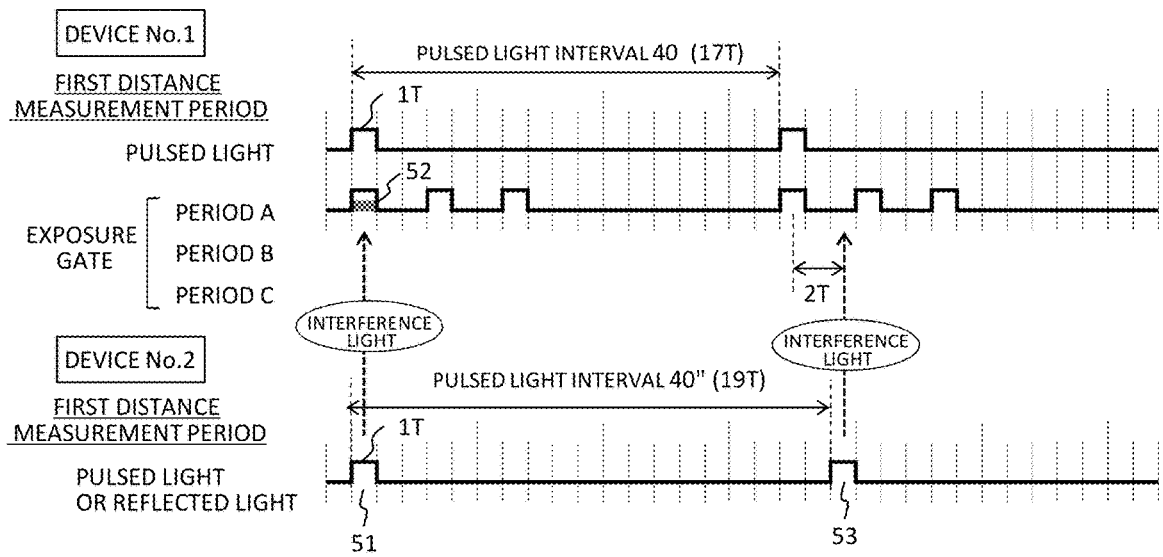
FIG. 10A to FIG. 10D are diagrams for description of an interference light measure by changing a pulsed light interval.

FIG. 10A is a diagram for description of measures against interference light by changing the pulsed light interval. Here, presuming two distance measurement image pickup apparatuses (hereinafter referred to as device No. 1 and device No. 2) simultaneously operating, interference in device No. 1 received from device No. 2 is considered. In each first distance measurement period, a pulsed light interval 40 of device No. 1 is set to 17T, a pulsed light interval 40" of device No. 2 is set to 19T, and the pulsed light intervals are made different from each other. To change the pulsed light interval in each device, it suffices that the length (see FIGS. 5A and 5B) of the non-exposure period 36 provided in the first distance measurement period is changed for each device. In this instance, since the pulse width (1T) in each device is fixed, the distance measurement accuracy and the distance measurement range do not change.

In this state, an influence of interference light between devices will be described. First, a state in which pulsed light 51 (irradiated light or reflected light) of device No. 2 is used as interference light and exposure is performed at an exposure gate (period A) 52 of device No. 1 is shown. However, subsequent pulsed light 53 (interference light) of device No. 2 is shifted by 2T from the exposure gate (period A) of device No. 1, and thus is not exposed. That is, thereafter, a period in which interference light from device No. 2 is exposed at the exposure gate (period A) of device No. 1 is expanded to a period (17×19T) of the least common multiple of the pulsed light intervals of both devices. However, including the fact that the exposure gate of device No. 1 is repeatedly opened three times in the period A, the amount of interference light to be exposed is reduced to 3/19 when compared to a case in which the pulsed light intervals of both devices are the same (both are 17T). Even though the timing of the exposure gate is different in the other periods (periods B and C), the amount of interference light to be exposed is reduced to 3/19, which is the same as that in the period A.

Figure 10B:
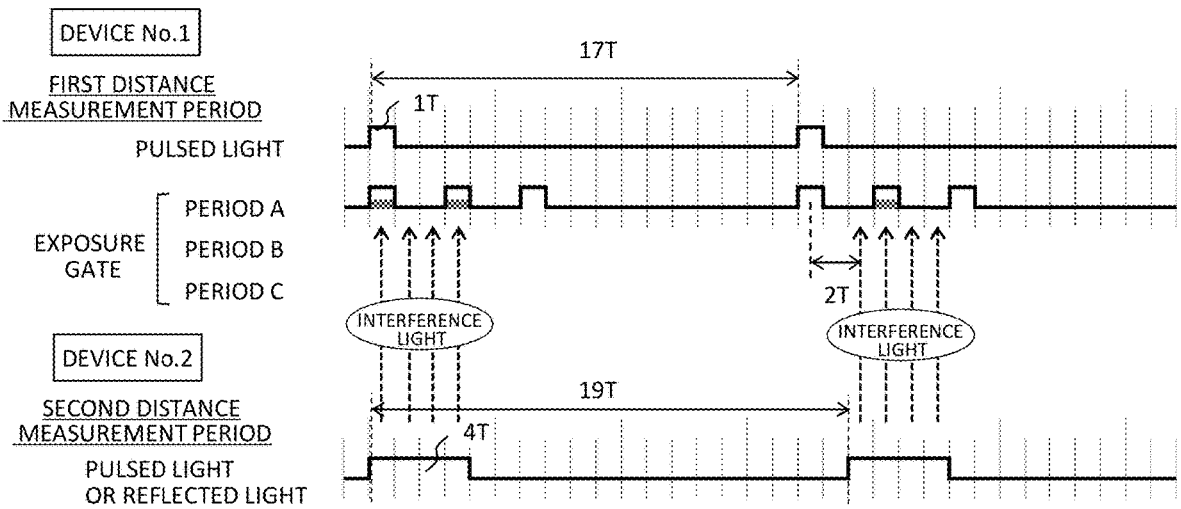
Figure 10C:
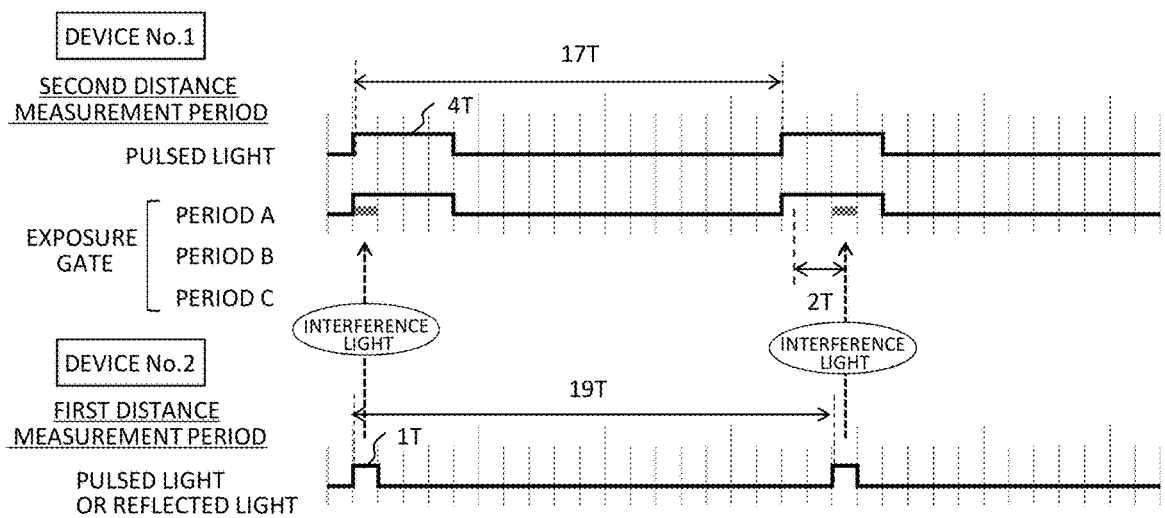
Figure 10D:
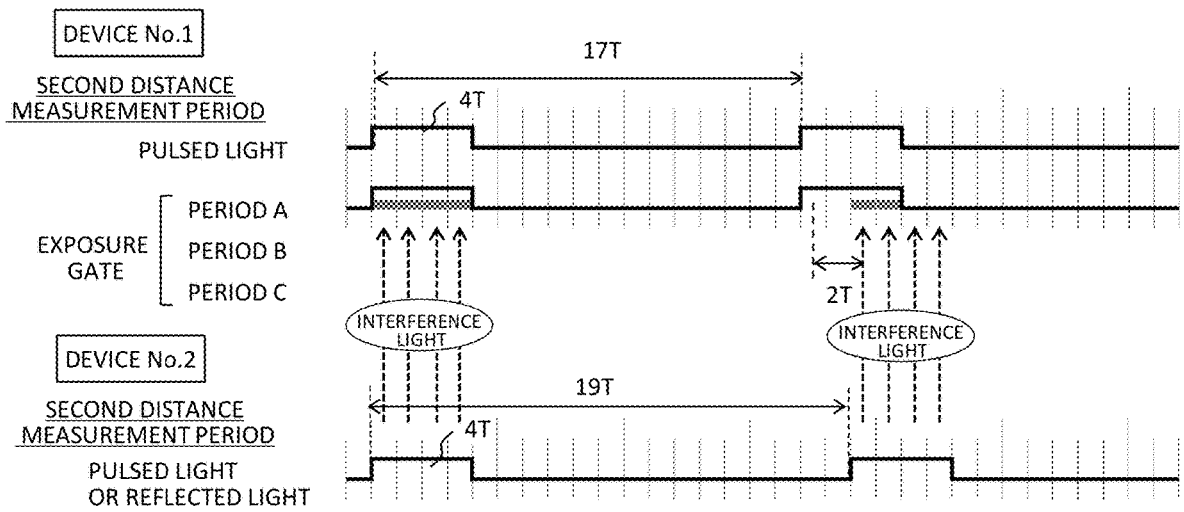

In the example of FIG. 10A, a description has been given of exposure of interference light from the first distance measurement period of device No. 2 with respect to the first distance measurement period of device No. 1. A combination of the interference light is not limited thereto. A state of interference light of the second distance measurement period of device No. 2 with respect to the first distance measurement period of device No. 1 is illustrated in FIG. 10B, and states of interference light of the first distance measurement period and interference light of the second distance measurement period of device No. 2 with respect to the second distance measurement period of device No. 1 are illustrated in FIG. 10C, and FIG. 10D, respectively. The pulsed light intervals of the second distance measurement periods of device No. 1 and device No. 2 are the same as the first distance measurement periods of the respective devices. The amount of interference light to be exposed is reduced to 6/19 in FIG. 10B and 4/19 in FIG. 10C and FIG. 10D when compared to a case in which the pulsed light intervals of both devices are the same (both are 17T). As described above, when the pulsed light intervals of the first distance measurement period and the second distance measurement period are made equal to each other, the same interference reduction effect can be obtained in any combination. Further, the pulsed light intervals of the first distance measurement period and the second distance measurement period may be set to have an integer multiple relationship. For example, when the pulsed light interval of the second distance measurement period is set to 38T, which is twice the pulsed light interval 19T of the first distance measurement period of device No. 2, the number of times of exposure in the second distance measurement period is reduced to half. However, there is an effect that the amount of interference light received by device No. 1 is reduced to half in FIG. 10B and FIG. 10D.

As described above, a period in which an influence of interference light is received between a plurality of devices expands to the least common multiple of the pulsed light intervals of the respective devices. Therefore, to increase the least common multiple, it is a great idea to set the values of the pulsed light intervals of the respective devices to be relatively prime. In addition, a unit for changing the pulsed light interval is not limited to 1T, and may correspond to an arbitrary numerical value less than 1T such as 0.5T or 0.25T. By setting the value to less than 1T, it is possible to select an interference-avoidable pulsed light interval in a lot of combinations without widening the range of the pulsed light interval.

Figure 11:
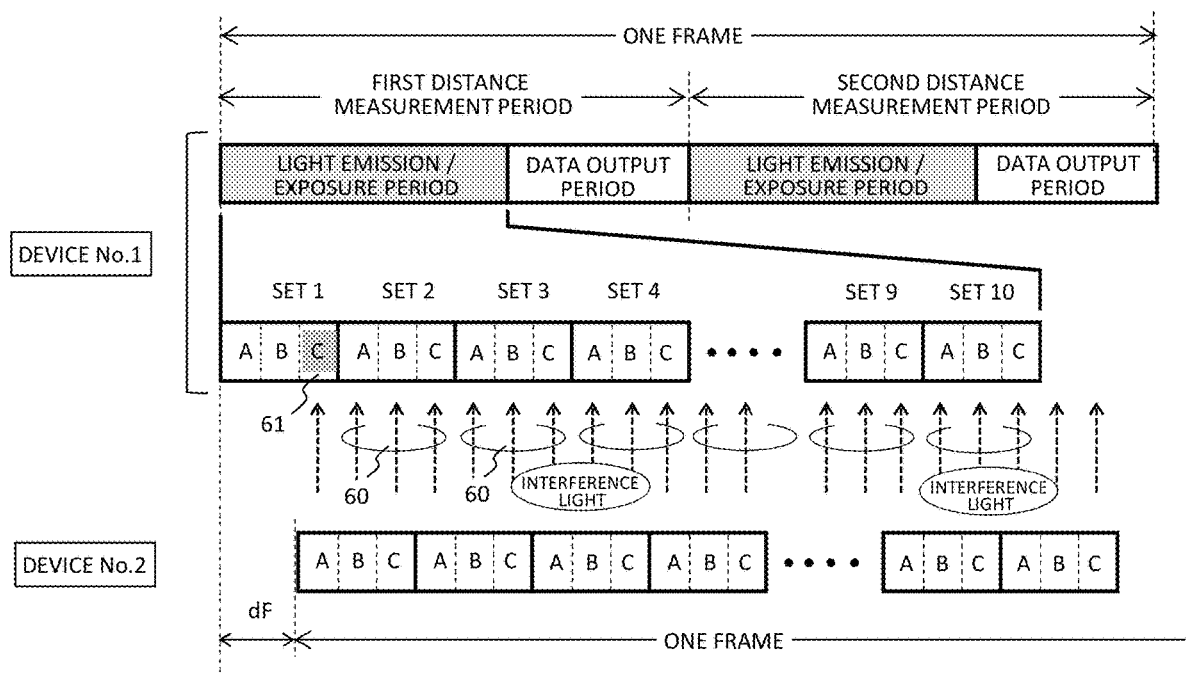
FIG. 11 is a diagram for description of a cancellation effect of interference light.

FIG. 11 is a diagram for description of a cancellation effect of interference light. Even when interference light from another device is exposed as illustrated in FIG. 10A, since difference computation of the exposure amount in three periods (periods A, B, and C) is performed in a process of distance computation, a component of interference light is canceled.

In general, a start timing of one frame is difference among a plurality of devices. Thus, a shift by dF occurs in the light emission/exposure periods (including set 1 to set 10) of device No. 1 and device No. 2. In an example of FIG. 11, the light emission/exposure periods of device No. 1 and device No. 2 are shifted from each other by about one set, and overlap each other in a period of set 2 to set 10 of device No. 1. In this overlapping period, device No. 1 exposes substantially the same amount of interference light 60 from device No. 2 at the exposure gates of periods A, B and C. Since these exposed interference light components are canceled in the process of distance computation, almost no distance error occurs.

However, in the first one set, interference light from device No. 2 is exposed only for an exposure gate 61 of the period C, and thus a distance error occurs in this portion. For example, when the pulsed light intervals of device No. 1 and device No. 2 correspond to a combination of FIG. 10A, interference light of 3/19 is exposed at the time of period C exposure as described above. However, since one light emission/exposure period includes the subsequent sets 2 to 10 in which the interference light is canceled, the influence of the interference light amount on the distance error is greatly reduced to 3/19×1/10=3/190 in the accumulation within the light emission/exposure period. For this reason, the distance error can be suppressed to a practically acceptable level.

A description will be given of a case in which the shift dF of the start timing of one frame changes and the overlapping period changes. For example, in a case in which interference light is exposed only at the exposure gates of the periods B and C in one set, the interference light is canceled in the periods B and C. Therefore, it suffices that imbalance due to the interference light not being exposed in the period A is considered as the influence, and the imbalance amount is 3/19 as described above. Therefore, in this case, the distance error is reduced to 3/190 in the accumulation within the light emission/exposure period.

In addition, when the start deviation dF exceeds one set period, the number of sets not receiving the interference light from device No. 2 increases, and thus the distance error becomes smaller as a whole.

The cancellation effect of the interference light described here depends on the combination of the pulsed light intervals of device No. 1 and device No. 2, and the pulsed light intervals are set so that the cancellation effect increases. In addition, a combination of pulsed light intervals is determined and applied such that the amount of interference light is reduced in any combination of the first distance measurement period and the second distance measurement period.

As described above, this example is characterized in that the non-exposure period is provided so that the pulsed light intervals of the respective apparatuses are different from each other to avoid interference when operating a plurality of the apparatuses. In this instance, a description has been given of the fact that distance measurement accuracy can be ensured by adopting the "extended pulse scheme" of repeating exposure a plurality of times for a light emission pulse having a short pulse width in the first distance measurement period and providing the non-exposure period thereto. However, the distance measurement accuracy may not be ensured in a method of inserting the non-exposure period in the conventional "continuous scheme". A reason will be described below.

Figure 12:
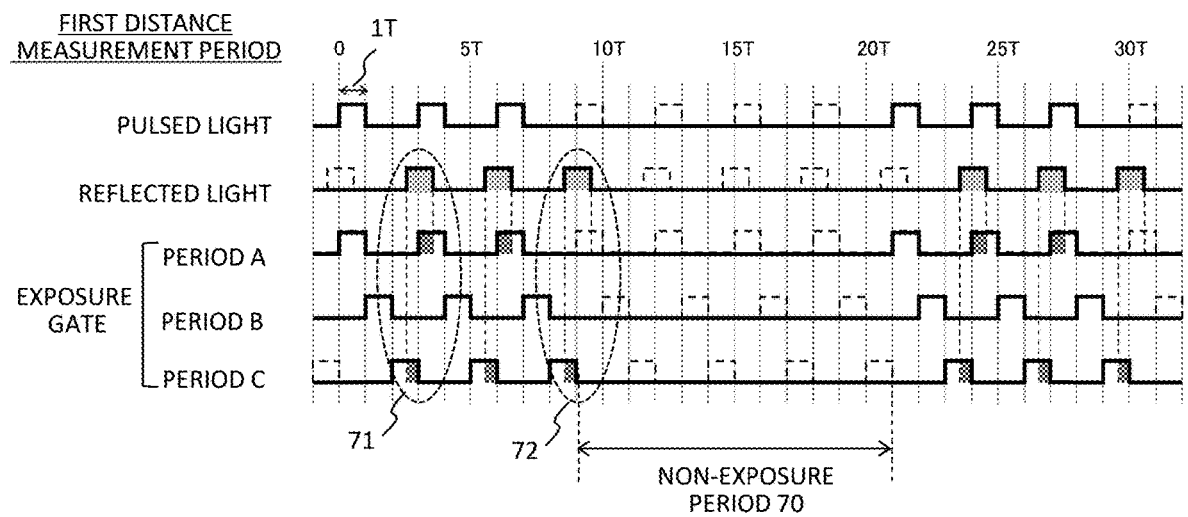
FIG. 12 is a diagram illustrating a time chart in a case in which a non-exposure period is provided in a continuous scheme.

FIG. 12 is a diagram illustrating a light emission/exposure time chart in a case in which the non-exposure period is provided in the continuous scheme. In the first distance measurement period, pulsed light is continuously irradiated with a short pulse width (high frequency). However, the non-exposure period 70 is inserted every fixed time in an irradiation period. This example shows a case in which a three-time continuous period is set for the pulsed light and the exposure gate, and a four-time non-exposure period 70 is provided thereafter. Then, it is conceivable to change the length of the non-exposure periods 70 to change the interval of the pulsed light to be irradiated to take measures against interference.

When the reflected light from the target is exposed at a timing illustrated in FIG. 12, exposure is performed in the period A and the period C as indicated by reference symbol 71. However, at a timing indicated by reference symbol 72, even though exposure is performed in the period C, exposure is not performed since the exposure gate in the period A is closed, and an imbalance occurs at the amount to be originally exposed in the period A and the period C.

Figure 13:
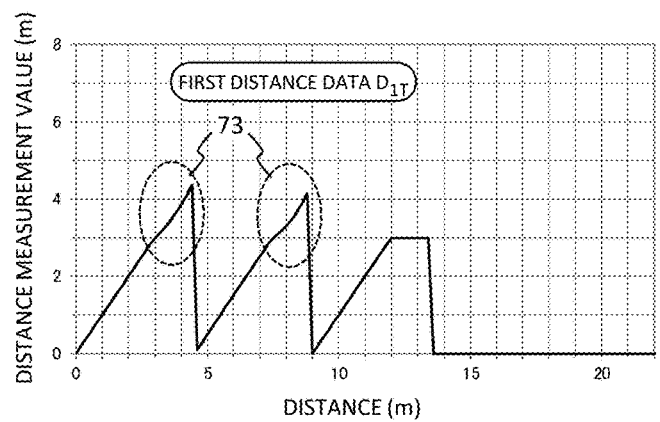
FIG. 13 is a diagram illustrating a distance error occurring due to an imbalance in exposure.

FIG. 13 is a diagram illustrating a distance error occurring due to an imbalance of exposure. First distance data $D_{1T}$ obtained from FIG. 12 is illustrated. A part indicated by reference symbol 73 is not a straight line and includes distortion due to an error. To reduce such a distance error, it suffices to increase the number of consecutive exposure gates. However, when the number of consecutive gates is increased, setting of the non-exposure period 70 is restricted and measures against interference light become insufficient. In other words, it is difficult to reduce distance measurement errors due to interference between a plurality of apparatus while ensuring the high distance measurement accuracy. As described above, the effect as in this example may not be obtained by merely inserting the non-exposure period in the "continuous scheme".

Example 2

In Example 2, a description will be given of an example in which the pulse width and the number of times of repetitive exposure are different from those in Example 1.

Figure 14A:
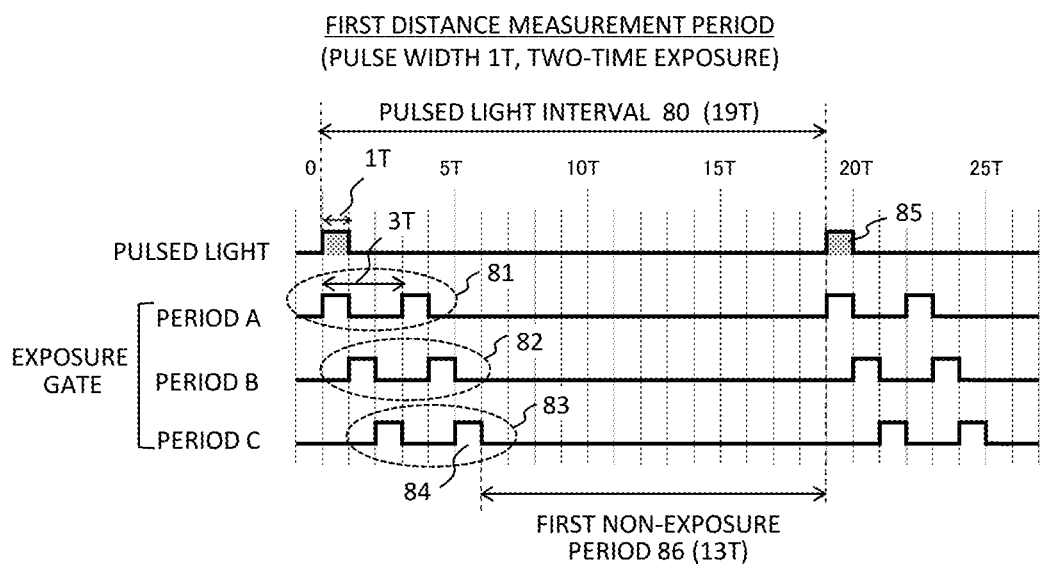
FIG. 14A and FIG. 14B are diagrams illustrating light emission/exposure time charts in Example 2.
Figure 14B:
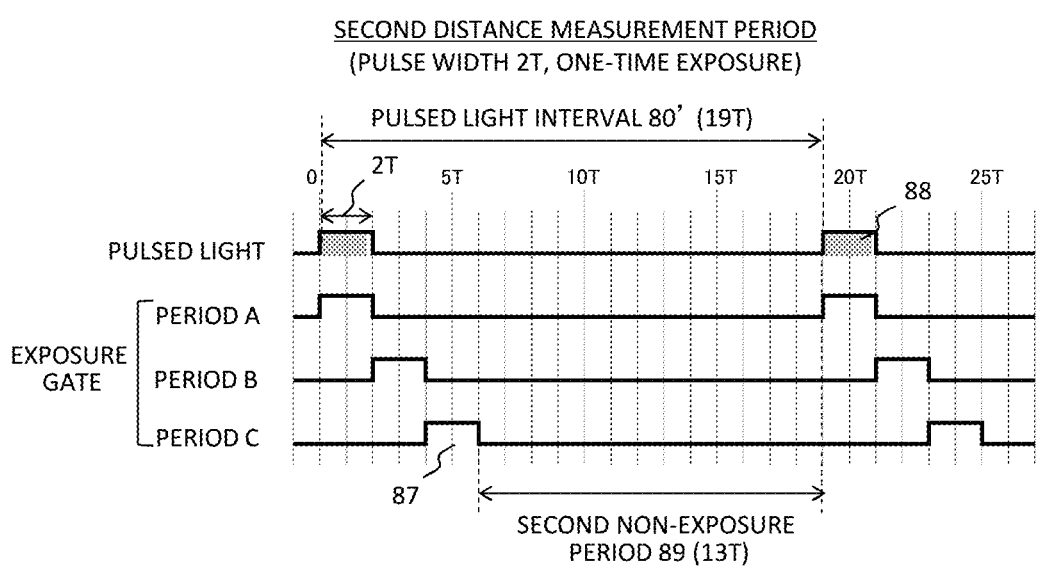

FIG. 14A and FIG. 14B are diagrams illustrating light emission/exposure time charts in Example 2.

FIG. 14A illustrates the light emission/exposure timing in the first distance measurement period. A short pulse width 1T is used for the light emission pulse. During the exposure period, exposure is performed in the periods A, B, and C, timing of each of which is shifted by 1T. In each period, the exposure gate is opened twice in a period 3T for one light emission pulse and repetitive exposure is performed (reference symbols 81, 82, and 83). That is, in this case, the "extended pulse scheme" is used. Then, from when a last exposure gate (reference symbol 84) is closed until subsequent pulsed light (reference symbol 85) is emitted, a first non-exposure period 86 (here, a width of 13T) in which exposure is not performed is provided. In this way, a pulsed light interval 80 has a width of 19T.

FIG. 14B illustrates the light emission/exposure timing in the second distance measurement period. A long pulse width 2T is used for the light emission pulse. During the exposure period, exposure is performed in the periods A, B, and C, timing of each of which is shifted by 2T. In each period, the exposure gate is opened once for one light emission pulse and exposure is performed, which corresponds to the conventional "pulse scheme". Then, from when a last exposure gate (reference symbol 87) is closed until subsequent pulsed light (reference symbol 88) is emitted, a second non-exposure period 89 (here, a width of 13T) in which exposure is not performed is provided. In this way, a pulsed light interval 80' has a width of 19T, which is equal to the pulsed light interval 80 in the first distance measurement period.

Next, the distance calculation method of Example 2 will be described (a figure corresponding to FIGS. 6A and 6B is omitted). As in Example 1, the charge amounts of the reflected light exposed in the periods A, B, and C are set to A, B, and C, respectively.

First, distance calculation in the first distance measurement period of FIG. 14A is shown. The delay time dT of the reflected light with respect to the irradiation light is expressed by the following equation.

If MIN($A, B, C$)=$C$, $dT=\{(B-C)/(A+B-2C)\} \cdot T+3nT$

If MIN($A, B, C$)=$A$, $dT=\{(C-A)/(B+C-2A)\} \cdot T+T+3nT$

If MIN($A, B, C$)=$B$, $dT=\{(A-B)/(C+A-2B)\} \cdot T+2T+3nT$

Here, n is the number of repetitions representing an nth period in which exposure is performed in two times of repetitive exposure, and n=0, 1 indicate the first time and the second time, respectively.

In measurement in the first distance measurement period, it is impossible to specify the number n of repetitions. Therefore, in the first distance measurement period, the first distance data $D_{1T}$ is computed from dT when n=0 as follows.

$D_{1T}=c \cdot dT_{(n=0)}/2$

Next, distance calculation in the second distance measurement period of FIG. 14B is shown. The delay time dT of the reflected light respect to the irradiation light is expressed by the following equation.

If $A \geq C$, $dT=\{(B-C)/(A+B-2C)\} \cdot 2T$

If $A < C$, $dT=\{(C-A)/(B+C-2A)\} \cdot 2T+2T$

From dT, the second distance data $D_{2T}$ is calculated.

$D_{2T}=c \cdot dT/2$

Thereafter, the number n of repetitions of the first distance measurement period is specified using the measurement result $D_{2T}$, of the second distance measurement period, and the accurate distance D is determined from the first distance data $D_{1T}$.

Figure 15:
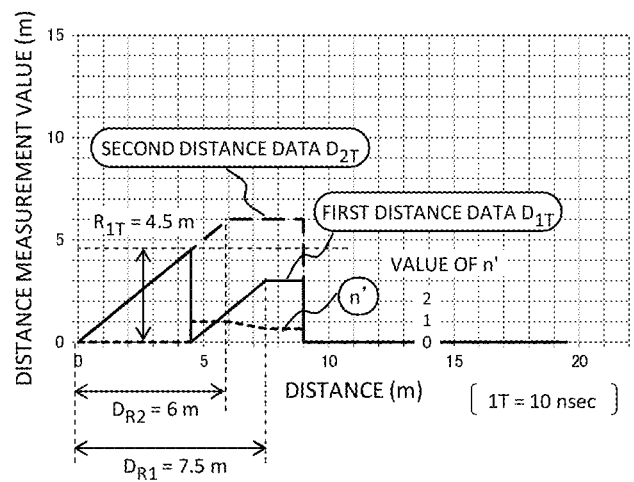
FIG. 15 is a diagram for description of a method of determining a distance from first/second distance measurement results.
Figure 16:
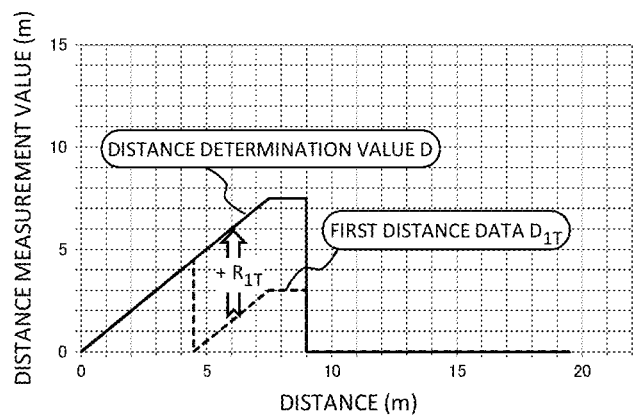
FIG. 16 is a diagram for description of a method of determining a distance from the first/second distance measurement results.

FIG. 15 and FIG. 16 are diagrams for description of a method of determining (de-aliasing) the distance using the first/second distance measurement results. Here, 1T=10 nsec.

FIG. 15 illustrates the first and second distance measurement results. The first distance data $D_{1T}$ (indicated by a solid line) in the first distance measurement period (pulse width=1T) is a straight line having a repetition, and a repetition distance $R_{1T}$ is 3cT/2=4.5 m. The second distance data $D_{2T}$ (indicated by a broken line) in the second distance measurement period (pulse width=2T) is a straight line without repetition.

In Example 2, the distance measurement ranges in the first distance data and the second distance data are different from each other. That is, a reflected light delay time $dT_{R1}$ and a distance measurement range $D_{R1}$ in the first distance measurement period are $dT_{R1}=1T \cdot (2 \times 3-1)=5T$, $D_{R1}=7.5$ m.

A reflected light delay time $dT_{R2}$ and a distance measurement range $D_{R2}$ in the second distance measurement period are $dT_{R2}=2T \cdot (1 \times 3-1)=4T$, $D_{R2}=6$ m.

In de-aliasing, using the second distance data $D_{2T}$, the number n of repetitions in the first distance data $D_{1T}$ is obtained in the following procedure. First, a ratio n' of a difference amount between the first and second distance data to the repetition distance $R_{1T}$ (=3cT/2) of the first distance measurement period is obtained.

$n'=(D_{2T}-D_{1T})/R_{1T}$ n' is indicated by a dotted line. Since measurement errors are included in the first distance data $D_{1T}$ and the second distance data $D_{2T}$, n' is not an original integer value and is involved with a fraction after a decimal point. Therefore, n' is converted into an integer.

$n=\text{ROUND}(n')$

Thus, a real value (integer value) n of the number of repetitions is obtained.

In this example, the distance measurement ranges $D_{R1}$ and $D_{R2}$ of $D_{1T}$ and $D_{2T}$ do not match each other. Thus, in a distance range 6 to 7.5 m, n' varies from 1 to 0.66. However, by setting n=1 using a round function, it is possible to correctly perform de-aliasing. In addition, conversion from n' into an integer n is not limited to the round function (rounding off), and a threshold value may be freely set according to a variation of a value of n'. In this example, it is possible to set n=0 when n'≤0.4, and n=1 when 0.4<n'.

FIG. 16 illustrates a distance output after de-aliasing. Using the true value n of the number of repetitions described above, the accurate distance D is determined by the following equation.

$D=D_{1T}+n \cdot R_{1T}=D_{1T}+n \cdot 3cT/2$

In this computation, since the first distance data $D_{1T}$ has high distance measurement accuracy and the repetition distance $R_{1T}$ to be added is a constant (3cT/2) determined from the unit time T and the speed of light c, the accurate distance D can be determined. In this way, measurement can be performed by achieving both high distance measurement accuracy and a wide distance measurement range.

In the case of Example 2, an exposure time is shortened in both the first distance measurement period and the second distance measurement period, and thus Example 2 is advantageous when compared to Example 1 in an environment in which there is a concern about a reduction in distance measurement accuracy due to external light such as sunlight. In addition, in Example 2, since the first non-exposure period 86 and the second non-exposure period 89 are provided, it is possible to reduce distance measurement errors due to interference between a plurality of apparatuses while ensuring high distance measurement accuracy as in Example 1.

<Relationship Between Pulse Width and Number of Times of Repetitive Exposure>

Here, a description will be given of an optimum relationship between the pulse width of the first distance measurement period (high frequency) and the number of times of repetitive exposure, and the pulse width of the second distance measurement period (low frequency).

In Example 1, the distance measurement ranges of the first and second distance measurement periods are made equal to each other. However, for example, a case in which the pulse width of the second distance measurement period is further widened and the distance measurement range of the second distance measurement period is made wider than the distance measurement range of the first distance measurement period is considered.

Figure 17:
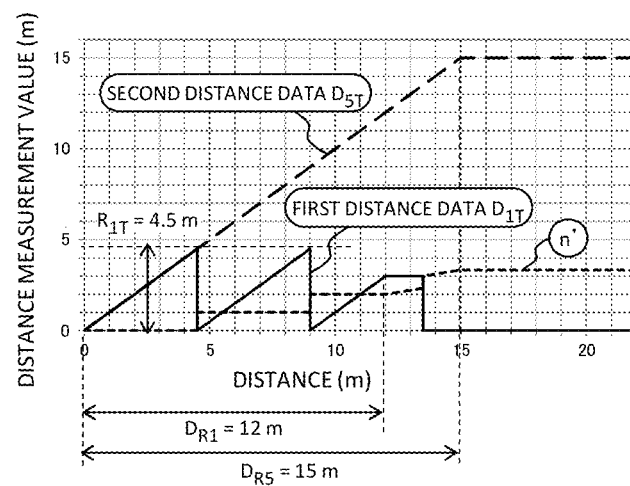
FIG. 17 is a diagram illustrating a case in which a measurement error is likely to occur as a modification of FIG. 5A and FIG. 5B.

FIG. 17 is a diagram illustrating a case in which a measurement error is likely to occur as a modification of FIGS. 5A and 5B. A distance measurement result of a case in which the pulse width of the first distance measurement period of FIG. 5A is 1T and the pulse width of the second distance measurement period of FIG. 5B is widened to 5T is shown. The first distance data $D_{1T}$ is indicated by a solid line, the second distance data $D_{5T}$ is indicated by a broken line, and a ration n' obtained by dividing a difference therebetween by the repetition distance $R_{1T}$ is indicated by a dotted line.

In this case, since the distance measurement ranges $D_{R1}$ and $D_{R5}$ of the first and second distance data $D_{1T}$ and $D_{5T}$ are not equal to each other, n' changes from 2 to 2.3 in a range of 12 to 13.5 m. However, de-aliasing can be performed by setting n=2 using a round function. However, when the pulse width of the second distance measurement period is widened to 5T, shot noise increases, the error of the second distance data $D_{5T}$ increases, and the variation in the value of n' increases. Thus, an error is more likely to occur during de-aliasing when compared to a case in which the pulse width is 4T. Therefore, it is desirable that the distance measurement range of the first distance measurement period and the distance measurement range of the second distance measurement period are made equal to each other.

When the pulse width of the first distance measurement period is set to $T_H$, the pulse width of the second distance measurement period is set to $T_L$, and the distance measurement ranges corresponding thereto are set to $D_{RH}$ and $D_{RL}$, a condition under which the distance measurement ranges of the first and second distance measurement periods are equal to each other is as follows.

$$D_{RH}=(cT_H/2)\cdot(3-1)$$

$$D_{RL}=(cT_L/2)\cdot(3n-1)$$

Here, c is the speed of light, and n is the number of times of repetitive exposure. A condition for $D_{RH}=D_{RL}$ is as follows.

$$T_L/T_H=(3n-1)/2$$

In Example 1 (FIGS. 5A and 5B), when the pulse width ratio is set to $T_L/T_H=4$, and the number of times of repetitive exposure on the pulse width $T_H$ side is set to n=3, the condition for $D_{RH}=D_{RL}$ is satisfied.

However, when n is an even number, $T_L/T_H$ does not become an integer. For example, when n=2, $T_L/T_H=2.5$ does not become an integer. In this case, the pulse width ratio $T_L/T_H$ may be set to 2.5 times without change.

However, $T_L$ can be only set to an integer multiple of $T_H$ in some cases. In this case, it is sufficient to use an integer value rounded off after the decimal point. That is, it is possible to use $T_L$ obtained with respect to $T_H$ using the following equation.

$$T_L/T_H=\text{ROUNDDOWN}[(3n-1)/2]$$

The ROUNDDOWN function performs processing to omit figures below the decimal point here.

Example 2 corresponds to this case, and the condition for $D_{RH}=D_{RL}$ is approximately satisfied by setting the pulse width ratio to $T_L/T_H=2$ and the number of times of repetitive exposure on the pulse width $T_H$ side to n=2.

According to the condition described above, since the distance measurement range of the first distance measurement period and the distance measurement range of the second distance measurement period are equal or close to each other, the distance measurement accuracy and the performance in the distance measurement range are balanced, and thus it is possible to perform most efficient measurement.

What is claimed is:

1. A distance measurement image pickup apparatus for measuring a distance to a target using a time of flight of light, the distance measurement image pickup apparatus comprising:
  a light emitting unit that irradiates the target with pulsed light emitted by a light source;
  a light receiving unit that exposes pulsed light reflected by the target using an image sensor and converts the pulsed light into an electric signal;
  a distance computation unit that computes a distance to the target from an output signal of the light receiving unit; and
  a controller that controls a light emission timing at which the pulsed light is irradiated from the light emitting unit and an exposure timing at which the pulsed light is exposed by the light receiving unit,
  wherein one frame corresponding to a unit of a measurement operation includes a first distance measurement period having a pulsed light width $T_H$ and a second distance measurement period having a pulsed light width $T_L$ (where $T_H<T_L$),
  the first distance measurement period is divided into a plurality of exposure periods in which exposure timings are shifted with respect to the irradiated pulsed light,
  an exposure gate is opened n times (n is plural) at a predetermined interval between one pulsed light and subsequent pulsed light to perform repetitive exposure in each of the divided exposure periods,
  a first non-exposure period in which exposure is not performed from when a last exposure gate is closed until subsequent pulsed light is irradiated is provided,
  the second distance measurement period is divided into a plurality of exposure periods in which exposure timings are shifted with respect to the irradiated pulsed light,
  an exposure gate is opened once to perform exposure between one pulsed light and subsequent pulsed light in each of the divided exposure periods, and
  a second non-exposure period in which exposure is not performed from when the exposure gate is closed until subsequent pulsed light is irradiated is provided.

2. The distance measurement image pickup apparatus according to claim 1,
  wherein a relationship below is satisfied among the pulsed light width $T_H$ in the first distance measurement period, the number n of times of repetitive exposure, and the pulsed light width $T_L$ in the second distance measurement period:

$$T_L/T_H=(3n-1)/2$$

or $T_L/T_H=\text{ROUNDDOWN}[(3n-1)/2]$ (where ROUNDDOWN is a function that omits figures below a decimal point).

3. The distance measurement image pickup apparatus according to claim 1,
  wherein lengths of the first non-exposure period and the second non-exposure period are set so that an interval of pulsed light in the first distance measurement period and an interval of pulsed light in the second distance measurement period are equal to each other or a ratio of pulsed light intervals has an integer multiple relationship.

4. A distance measurement system for measuring a distance to a target by operating a plurality of distance measurement image pickup apparatuses according to claim 1,
  wherein the lengths of the first non-exposure period and the second non-exposure period are set so that an interval of pulsed light irradiated by each of the distance measurement image pickup apparatuses is different between the apparatuses.

5. The distance measurement system according to claim 4, wherein the lengths of the first non-exposure period and the second non-exposure period are set so that values of intervals of pulsed light irradiated by the respective distance measurement image pickup apparatuses are relatively prime.

* * * * *